United States Patent
Konstantinov

(10) Patent No.: US 8,704,546 B2
(45) Date of Patent: Apr. 22, 2014

(54) METHOD OF MANUFACTURING A SIC BIPOLAR JUNCTION TRANSISTOR AND SIC BIPOLAR JUNCTION TRANSISTOR THEREOF

(71) Applicant: Fairchild Semiconductor Corporation, San Jose, CA (US)

(72) Inventor: Andrei Konstantinov, Sollentuna (SE)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/689,681

(22) Filed: Nov. 29, 2012

(65) Prior Publication Data

US 2013/0087809 A1  Apr. 11, 2013

Related U.S. Application Data

(63) Continuation of application No. 13/279,053, filed on Oct. 21, 2011, and a continuation of application No. PCT/EP2011/068411, filed on Oct. 21, 2011.

(60) Provisional application No. 61/408,173, filed on Oct. 29, 2010.

(30) Foreign Application Priority Data

Oct. 29, 2010  (SE) ........................................ 1051137

(51) Int. Cl.
*G01R 31/26* (2006.01)
(52) U.S. Cl.
USPC .................................................. 324/762.08
(58) Field of Classification Search
USPC .......... 324/762.01–762.1; 438/14–18; 257/48
See application file for complete search history.

(56) References Cited

U.S. PATENT DOCUMENTS

| | | |
|---|---|---|
| 2003/0080842 A1 | 5/2003 | Sumakeris et al. |
| 2006/0011128 A1 | 1/2006 | Ellison et al. |
| 2007/0117336 A1 | 5/2007 | Sumakeris et al. |
| 2007/0145378 A1 | 6/2007 | Agarwal et al. |
| 2007/0221614 A1 | 9/2007 | Sumakeris |
| 2010/0133550 A1 | 6/2010 | Zhang et al. |
| 2011/0045281 A1 | 2/2011 | Myers-Ward et al. |

FOREIGN PATENT DOCUMENTS

| | | |
|---|---|---|
| EP | 1 693896 A1 | 8/2006 |
| EP | 2192211 A1 | 6/2010 |
| JP | 2004140302 A | 4/2011 |
| WO | 03/038876 A1 | 5/2003 |
| WO | 2008/088019 A1 | 7/2008 |
| WO | 2008127186 A1 | 10/2008 |

OTHER PUBLICATIONS

International Search Report received for PCT Patent Application No. PCT/EP2011/068411, mailed on Jan. 16, 2012, 4 pages.

(Continued)

*Primary Examiner* — Tung X Nguyen

(57) ABSTRACT

A method of manufacturing a silicon carbide (SiC) bipolar junction transistor (BJT) and a SiC BJT are provided. The SiC BJT comprises an emitter region, a base region and a collector region. The collector region is arranged on a substrate having an off-axis orientation of about 4 degrees or lower. Further, a defect termination layer (DTL) is arranged between the substrate and the collector region. A thickness and a doping level of the DTL are configured to terminate basal plane dislocations in the DTL and reduce the growth of defects from the DTL to the collector region. At least some of the embodiments are advantageous in that SiC BJTs with improved stability are provided. Further, a method of evaluating the degradation performance of a SiC BJT is provided.

19 Claims, 3 Drawing Sheets

(56) References Cited

OTHER PUBLICATIONS

Written Opinion received for PCT Patent Application No. PCT/EP2011/068411, mailed on Jan. 16, 2012, 6 pages.

Zhang et al., "Implantation-Free 4H-SiC Bipolar Junction Transistors With Double Base Epilayers", IEEE Electron Device Letters, vol. 29 No. 5, May 2008, pp. 471-473.

Konstantinov, A. et al., "Operation of Silicon Carbide BJTs Free from Bipolar Degradation", Tran Tech Publications, Switzerland, doi: 10.4028/www.scientific.net/MSF.645-648.1057,(2010).

Vanmil, B. L., et al., "Basal Plane Dislocation Mitigation in 8 Degree Off-cute 4H-SiC Through in situ Grow1h Interrupts During Chemical Vapor Deposition", Materials Science Forum vol. 615-617 (2009) pp. 61-66.

Tsuchida, H. et al., "Investigation of Basal Plane Dislocations in the 4H-SiC Epilayers Grown on {0001} Substrates", Materials Science Forum vols. 483-485 (2005) pp. 97-100.

Stahlbush, R. E., et al., "A Pictorial Tracking of Basal Plane Dislocations in SiC Epitaxy", Material Science Forum vols. 645-648 (2010) pp. 271-276.

Skowronski, M. et al., "Degradation of Hexagonal Silicon-Carbide-Based Bipolar Devices", Journal of Applied Physics, 99 011101 (2006), 24 pages.

Kallinger, B. et al., "Dislocation Conversion and Propagation During Homoepitaxial Growth of 4H-SiC", Materials Science Forum vols. 645-648 (2010) pp. 299-302.

Kallinger, B. et al., "Influence of Substrate Preparation and Epitaxial Growth Parameters on the Dislocation Densities in 4H-SiC Epitaxial Layers", Materials Science Forum vols. 600-603 (2009) pp. 143-146.

Dudley, M. et al., "Characterization of 100 mm Diameter 4H-Silicon Carbide Crystals With Extremely Low Basal Plane Dislocation Density", Materials Science Forum vols. 645-648 (2010) pp. 291-294.

Chen, W. et al., "Growth and Characterization of 4H-SiC Epilayers on Substrates With Different Off-Cut Angles", Journal of Applied Physics 98, 114007 (2005), 6 pages.

Response to 2nd Written Opinion for PCT Patent Application No. PCT/EP2011/068411, mailed on Oct. 23, 2012, 6 pages.

Response to Written Opinion for PCT Patent Application No. PCT/EP2011/068411, mailed on Mar. 23, 2012, 11 pages.

2nd Written Opinion received for PCT Patent Application No. PCT/EP2011/068411, mailed on Oct. 2, 2012, 5 pages.

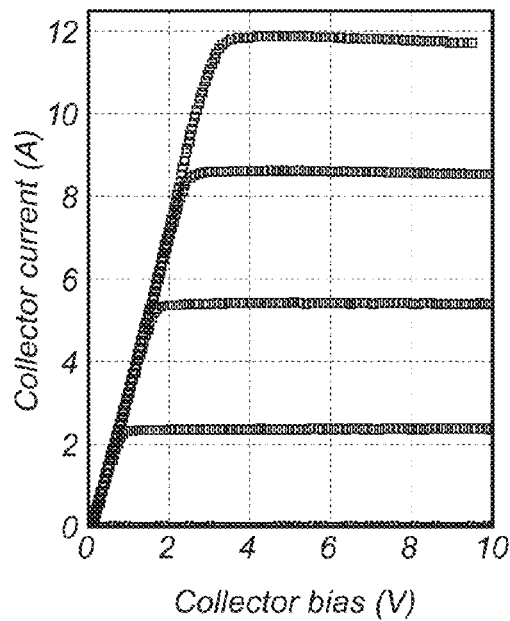
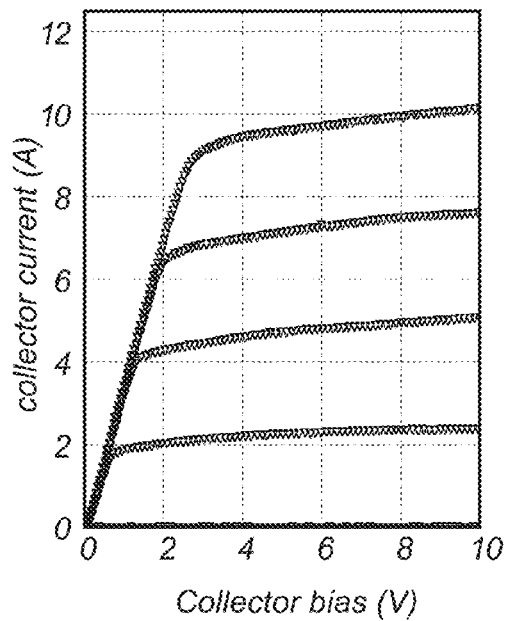
Fig. 3a    Fig. 3b
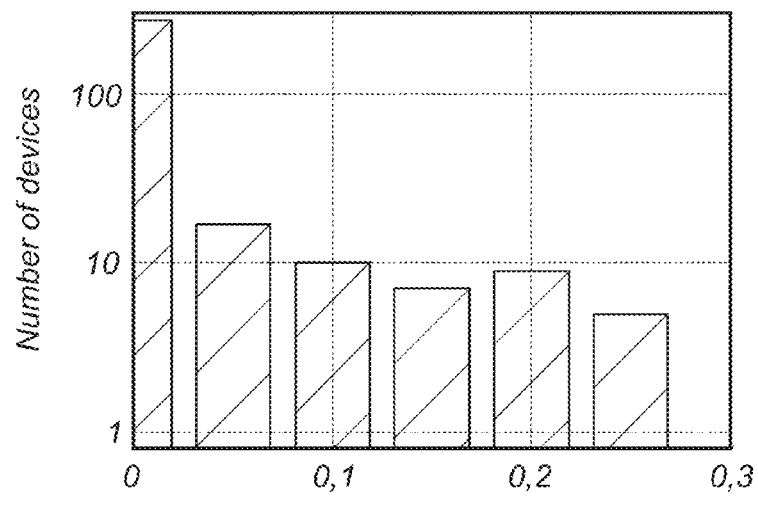
Fig. 4

METHOD OF MANUFACTURING A SIC BIPOLAR JUNCTION TRANSISTOR AND SIC BIPOLAR JUNCTION TRANSISTOR THEREOF

CROSS-REFERENCE TO RELATED APPLICATIONS

The present application is continuation of U.S. patent application Ser. No. 13/279,053, entitled "Method of Manufacturing a SiC Bipolar Junction Transistor and SiC Bipolar Junction Transistor Thereof", filed on Oct. 21, 2011, which claims priority to and the benefit of U.S. Provisional Patent Application No. 61/408,173, entitled "Method of Manufacturing a SiC Bipolar Junction Transistor and SiC Bipolar Junction Transistor Thereof", filed on Oct. 29, 2010, and priority to and the benefit of Swedish Patent Application No. 1051137-6, filed on Oct. 29, 2010, all of which are incorporated herein by reference in their entireties.

The present application is also a continuation of PCT Patent Application No. PCT/EP2011/068411, entitled "Method of Manufacturing a SiC Bipolar Junction Transistor and SiC Bipolar Junction Transistor Thereof", filed on Oct. 21, 2011, which claims priority to and the benefit of U.S. Provisional Patent Application No. 61/408,173, entitled "Method of Manufacturing a SiC Bipolar Junction Transistor and SiC Bipolar Junction Transistor Thereof", filed on Oct. 29, 2010, and priority to and the benefit of Swedish Patent Application No. 1051137-6, filed on Oct. 29, 2010, all of which are incorporated herein by reference in their entireties.

TECHNICAL FIELD

The present disclosure relates to the field of high power semiconductor device technology and, in particular, to high power silicon carbide (SiC)-based devices such as SiC bipolar junction transistors. More specifically, the present disclosure relates to a method of manufacturing a SiC bipolar junction transistor (BJT), a SiC BJT and a method of evaluating the degradation performance of a SiC BJT.

BACKGROUND

Silicon carbide bipolar junction transistors (SiC BJTs) are high-performance power devices having low on-state and switching losses and are also capable of high-temperature operation thanks to the high breakdown electric field, high thermal conductivity and high saturated drift velocity of electrons in SiC. SiC is a wide bandgap semiconductor and may advantageously be used for manufacturing devices for high power, high temperature and high frequency applications.

The use of high power SiC BJTs can e.g. decrease the energy loss, the device size and the weight of switch-mode power conversion (SMPC) devices, since SiC BJTs have lower conduction and switching losses than conventional silicon devices. SMPC devices are extensively used in a number of electrical energy conversion systems. One example of such system is a Direct Current to Direct Current (DC-DC) electrical energy conversion system. An SMPC device may also be used in other applications, such as Alternating Current (AC) to DC conversion systems, AC-AC conversion systems and DC-AC conversion systems. High power SiC BJTs can also increase power and efficiency of Radio-Frequency (RF) power generators, as well as decrease the size and the weight of such generators.

SiC power devices, such as SiC BJTs, are however vulnerable to device degradation, such as the so-called bipolar degradation phenomenon, which is a deterioration of the device performance under the conditions of minority carrier injection. Thus, implementation of the above mentioned SMPC devices and RF generators comprising SiC BJTs is usually hindered by the instability of the SiC BJTs in the course of long-term operation.

Generally, bipolar degradation in SiC results from the growth of stacking faults (SFs) that is induced by minority carrier injection in the device. The SFs may either exist in as-grown material or originate from basal plane dislocations (BPDs), as a result of BPD splitting into Shockley partials. In case of BPD splitting, one of the partials remains bound to the location of the BPD whereas the other partial may travel tens or even hundreds of microns in the device as long as minority carriers are provided to the leading edge of the partial. The glide of a partial dislocation occurs in general within the basal (0001) crystal plane. The (0001) plane portion between the two partials will then represent a stacking fault.

The stacking faults may then form resistive barriers for current flow in the device and create channels for fast minority carrier recombination. The growth of stacking faults therefore suppresses vertical transport of minority carriers in the device and increases the on-state forward voltage drop. In BJTs, stacking faults also degrade the performance. In particular, the growth of SFs increases the on-state resistance and decreases the emitter current gain. Thus, there is a need to provide high-power devices that are free (or at least with a reduced number) of BPDs at least in the active parts or regions of the devices, i.e. at least in those parts of the device that are subject to minority carrier injection.

The manufacturing of stable, high power, SiC switching devices can have substantially large crystal areas that are free from defects potentially deteriorating their performance. On-state current densities in high-voltage high-power SiC devices typically range between 100 A/cm$^2$ and a few hundred A/cm$^2$. For example, the current densities for high power BJTs may be selected between 100 and 200 A/cm$^2$ for a blocking voltage of 1200 V. A high-power device rated at 10 A may therefore cover about 5 mm$^2$ and devices operating at higher currents may take up even larger areas. However, a standard commercial-grade epitaxy provides a BPD density in the order of 100-200 cm$^{-2}$, thereby resulting in about five or more BPDs in average within the device area. There is therefore a need of providing manufacturing methods that yield high-power devices free of BPDs, or at least with a reduced number of BPDs.

For example, some known methods can be based on a defect-selective etch of SiC substrates prior to epitaxial growth. The selective etch forms etch-generated structures from at least any basal plane dislocation reaching the substrate surface, i.e. etch pits of a few microns deep around each dislocation. Although the BPD density may be reduced in the epitaxial layer, the known methods can present the drawback that the layer morphology resulting from the defect-revealing etch is deteriorated. As the total etch pit density in SiC substrates may exceed 1000/cm$^2$, any subsequent portions in the semiconductor process is rendered very complicated.

Thus, there is a need for providing new high-power SiC BJTs and new methods of manufacturing such BJTs that would alleviate at least some of the above-mentioned drawbacks.

SUMMARY

An object of at least some of the embodiments is to alleviate at least some of the above disadvantages and drawbacks of the prior art and to provide an improved alternative to the above technique and prior art.

Generally, it is an object of at least some of the embodiments to provide a high-power semiconductor device, in particular a SiC BJT, with improved stability. Further, it is an object of the at least some of the embodiments to provide a method of manufacturing a SiC BJT that reduces degradation of the device under operation.

These and other objects of at least some of the embodiments are achieved by the methods in, for example, claim 1, the SiC BJT as defined in claim 7 and the method of evaluating the performance of a SiC BJT as defined in claim 15. Preferred embodiments are defined in the dependent claims.

According to a first aspect of at least some of the embodiments, there is provided a method of manufacturing a silicon carbide bipolar junction transistor (SiC BJT). The method can include providing (or forming) a (SiC) collector region (or layer) on a substrate having an off-axis orientation of about 4 degrees or lower and providing (or forming) a defect termination layer (DTL) arranged between the substrate and the collector region. The method further can include adjusting the thickness and the doping level of the DTL.

According to a second aspect of at least some of the embodiments, there is provided a SiC BJT. The SiC BJT comprises an emitter region, a base region and a collector region (or layer). The collector region is arranged on a substrate having an off-axis orientation of about 4 degrees or lower and a defect termination layer (DTL) is arranged between the substrate and the collector region. The thickness and the doping level of the DTL are configured to terminate basal plane dislocations in the DTL layer and reduce (or prevent) the growth of defects from the DTL to the collector region.

At least some of the embodiments are based on the understanding that a defect termination layer arranged between the substrate and the collector region of a SiC BTJ can prevent growth of defects, in particular stacking faults (SFs), in the course of device operation. The DTL is advantageous in that it has a dual function. First, the DTL is configured to terminate, within the DTL, basal-plane dislocations (BPDs) that act as seeds for the growth of stacking faults. In other words, with the DTL, the basal plane dislocations do not reach the active regions of the BJT, such as the collector, the base and the emitter. Second, the DTL is configured to prevent the growth of the SFs that may be seeded by the BPDs that are present in the substrate or by the BPDs in the near-substrate portion of the DTL. In particular, the inventor has realized that the thickness of the DTL and the doping level of the DTL may be adjusted for terminating the BPDs in the DTL and for preventing the growth of SFs from the DTL to the collector region. At least some of the embodiments are advantageous in that it enables the manufacturing of a SiC BJT with a defect-free, or at least a reduced number of defects, in the collector region of the BJT, thereby increasing the stability of the BJT.

Further, at least some of the embodiments are advantageous in that, by adjusting the thickness and/or the doping level of the DTL, large area devices with improved stability can be manufactured since the DTL prevents the growth of stacking faults into the active region from the BPDs present in the substrate.

At least some of the embodiments are advantageous in that the DTL prevents bipolar degradation of the BJT under operation. More specifically, at least some of the embodiments are advantageous in that it provides a SiC BJT and a method for manufacturing such a BJT that prevent undesired growth of SFs under minority carrier injection conditions (even in large-area bipolar devices).

As compared to prior art methods, at least some of the embodiments are advantageous in that it provides a stable SiC BJT on a substantially flat substrate, at least without deteriorating the layer morphology of the device (BJT). The present embodiments facilitate therefore any subsequent portion in the processing of the SiC BJT.

According to an embodiment, the off-axis orientation of the substrate may be comprised in the range of about 2 to 4 degrees, which is advantageous in that, on the one hand, an off-axis of about (or at least) 2 degrees reduces the bunching of surface steps and nucleation of other polytypes during epitaxial growth of SiC and, on the other hand, the off-axis that is not higher than about 4 degrees reduces the BPD density.

According to an embodiment, the DTL thickness is adjusted to be at least the sum of the thickness for converting the BPDs to threading edge dislocations (TEDs) and the thickness for blocking minority carrier access from the collector region of the BJT to the DTL. In the present embodiment, the DTL may be considered to be formed by a lower portion interfacing the substrate and a higher portion (or upper portion) interfacing the collector layer. The lower portion of the DTL (with respect to the growth direction of the layers of the BJT) is configured to terminate the BPDs and its thickness is selected to be sufficient to convert the BPDs into TEDs, which are not as harmful to device stability as compared to BPDs since TEDs generally do not split into partials and do not produce stacking faults. The transformation of a BPD into TED corresponds to a change of the line direction of the dislocation from in-plane to the threading line direction, i.e. to almost the normal to the basal plane. The higher portion (or upper portion) of the DTL is configured to block the access of minority carrier to any dislocation that may be present in the substrate or may be terminated in the DTL. The access of minority carriers is dependent on both the thickness and the doping level of the DTL. Thus, the thickness of the higher portion (and thereby the total thickness of the DTL) and the doping level of the DTL are selected to block minority carrier access from the collector region of the BJT to the lower portion of the DTL.

In this respect, it will be appreciated that SFs are two-dimensional crystal defects (portions of crystal planes), whereas dislocations are one-dimensional crystal imperfections, i.e. line defects. These two types of defects are therefore different. The growth of SFs in operating SiC devices can be performed based on a combination of minority carrier injection and of a proper seed, such as a BPD. As there is a certain probability for minority carrier diffusion through the buffer layer down to the substrate, where the BPDs are abundant, the growth of a stacking fault may then proceed from the substrate, through the DTL and into the collector region, thereby degrading the BJT performance. The inventor has recognized that a mere removal of the BPDs from the collector layer does not eliminate the growth of SFs.

The DTL of the BJT according to at least some of the embodiments are therefore configured to block the possibility of SF formation in the substrate or in the DTL itself with possible subsequent SF growth into the collector region by adjusting both the doping and the thickness of the DTL.

In particular, a lower portion of the DTL (i.e. the portion of the DTL adjacent or closest to the substrate) may be configured to terminate basal plane dislocations originating from the substrate and/or to convert the basal plane dislocations into threading edge dislocations, and a higher portion of the DTL (i.e. the portion of the DTL being adjacent or closest to the collector region) may be configured to block the access of minority carrier to any dislocation terminated in the DTL.

More specifically, the thickness and the doping level of a higher portion of the DTL are selected to block minority carrier access from the collector region of the BJT to a lower portion of the DTL.

According to an embodiment, the thickness of the DTL may be comprised in the range of about 12 to 30 micrometers.

According to an embodiment, the doping level of the DTL may be comprised in the range of about $3\times10^{18}$ to $2\times10^{19}$ cm$^{-3}$, and preferably in the range of about $5\times10^{18}$ to $1\times10^{19}$ cm$^{-3}$, which is advantageous since a relatively high donor doping (e.g. Nitrogen donors) contributes to the blocking of the access of minority carriers to any BPDs terminated in the DTL or in the substrate.

As will be further illustrated in the detailed description, stable BJTs can be manufactured with a DTL having a thickness comprised in the range of about 12 to 30 micrometers and a doping level in the range of about $3\times10^{18}$ to $2\times10^{19}$ cm$^{-3}$.

According to an embodiment, the DTL may be provided by epitaxial growth of SiC on top of the substrate and the dopant atom may be Nitrogen.

In particular, the SiC BJT may be a NPN BJT wherein the collector layer is an n-type collector region (acting as the voltage blocking layer) and the BJT further comprises a p-type base region and an n-type emitter region. The DTL may then be arranged between the substrate and the collector region. Although at least some of the embodiments are not limited to the following values, the doping levels are normally in the mid $10^{15}$ cm$^{-3}$ range for the collector region, in the mid $10^{17}$ cm$^{-3}$ range for the base region and in the order of $10^{19}$ cm$^{-3}$ for the emitter region.

According to an embodiment, the SiC BJT may further comprise a surface recombination suppression layer made of dielectric material and provided at a sidewall of the emitter region. Advantageously, this layer may be deposited both on the emitter region and around the emitter region. The present embodiment is advantageous in that it further improves the stability of the transistor.

According to a further embodiment, a switch-mode electrical power conversion device (or SMPC device) comprising a SiC BJT as defined any one of the preceding embodiments is provided, which is advantageous in that it results in an SMPC device with improved (longer) stability.

According to yet a further embodiment, a high power Radio-Frequency (RF) generator comprising a SiC BJT as defined in any one of the preceding embodiments is provided, which is advantageous in that it results in a high power RF generator with improved stability.

According to a third aspect, a method of evaluating the degradation performance of a SiC BJT comprising a collector region, a base region and an emitter region, is provided. The method can include applying a forward base-collector current under open emitter conditions, applying a stress current larger than the rated maximum base-emitter current of the BJT and maintaining the BJT at a temperature comprised in the range of about 80° C. to 120° C.

In particular, the current density may be comprised in the range of about 5 to 50 A per 1 cm$^2$ of the base area.

Further objectives, features, and advantages, will become apparent when studying the following detailed disclosure, the drawings and the appended claims. Those skilled in the art will realize that different features can be combined to create embodiments other than those described in the following.

BRIEF DESCRIPTION OF THE DRAWINGS

The above, as well as additional objects, features and advantages, will be better understood through the following illustrative and non-limiting detailed description of embodiments, with reference to the appended drawings, in which:

FIGS. 3a and 3b show the output characteristic of a stable high-power high-voltage BJT manufactured in accordance with an exemplifying embodiment and the output characteristic of a degraded device, respectively;

FIG. 4 shows statistics of the conductance of the active region of BJTs in accordance with an embodiment;

Figure 1:
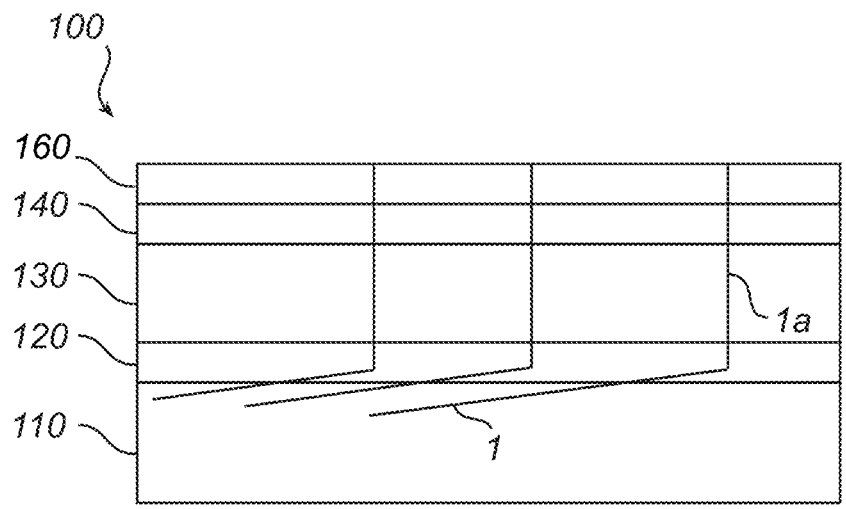
FIG. 1 shows a schematic view of SiC BJT comprising a collector layer, a base layer and an emitter layer in accordance with an exemplifying embodiment.

All the figures are schematic, not necessarily to scale, and show parts to elucidate some embodiments, wherein other parts may be omitted or merely suggested.

DETAILED DESCRIPTION

According to a first aspect of at least some of the embodiments, there is provided a method of manufacturing a silicon carbide bipolar junction transistor (SiC BJT). The method can include providing (or forming) a (SiC) collector region (or layer) on a substrate having an off-axis orientation of about 4 degrees or lower and providing (or forming) a defect termination layer (DTL) arranged between the substrate and the collector region. The method further can include adjusting the thickness and the doping level of the DTL.

According to a second aspect of at least some of the embodiments, there is provided a SiC BJT. The SiC BJT comprises an emitter region, a base region and a collector region (or layer). The collector region is arranged on a substrate having an off-axis orientation of about 4 degrees or lower and a defect termination layer (DTL) is arranged between the substrate and the collector region. The thickness and the doping level of the DTL are configured to terminate basal plane dislocations in the DTL layer and reduce (or prevent) the growth of defects from the DTL to the collector region.

At least some of the embodiments are based on the understanding that a defect termination layer arranged between the substrate and the collector region of a SiC BTJ can prevent growth of defects, in particular stacking faults (SFs), in the course of device operation. The DTL is advantageous in that it has a dual function. First, the DTL is configured to terminate, within the DTL, basal-plane dislocations (BPDs) that act as seeds for the growth of stacking faults. In other words, with the DTL, the basal plane dislocations do not reach the active regions of the BJT, such as the collector, the base and the emitter. Second, the DTL is configured to prevent the growth of the SFs that may be seeded by the BPDs that are present in the substrate or by the BPDs in the near-substrate portion of the DTL. In particular, the inventor has realized that the thickness of the DTL and the doping level of the DTL may be adjusted for terminating the BPDs in the DTL and for preventing the growth of SFs from the DTL to the collector region. At least some of the embodiments are advantageous in that it enables the manufacturing of a SiC BJT with a defect-free, or at least a reduced number of defects, in the collector region of the BJT, thereby increasing the stability of the BJT.

Further, at least some of the embodiments are advantageous in that, by adjusting the thickness and/or the doping level of the DTL, large area devices with improved stability can be manufactured since the DTL prevents the growth of stacking faults into the active region from the BPDs present in the substrate.

At least some of the embodiments are advantageous in that the DTL prevents bipolar degradation of the BJT under operation. More specifically, at least some of the embodiments are advantageous in that it provides a SiC BJT and a method for manufacturing such a BJT that prevent undesired growth of SFs under minority carrier injection conditions (even in large-area bipolar devices).

As compared to prior art methods, at least some of the embodiments are advantageous in that it provides a stable SiC BJT on a substantially flat substrate, at least without deteriorating the layer morphology of the device (BJT). The present embodiments facilitate therefore any subsequent portion in the processing of the SiC BJT.

According to an embodiment, the off-axis orientation of the substrate may be comprised in the range of about 2 to 4 degrees, which is advantageous in that, on the one hand, an off-axis of about (or at least) 2 degrees reduces the bunching of surface steps and nucleation of other polytypes during epitaxial growth of SiC and, on the other hand, the off-axis that is not higher than about 4 degrees reduces the BPD density.

According to an embodiment, the DTL thickness is adjusted to be at least the sum of the thickness for converting the BPDs to threading edge dislocations (TEDs) and the thickness for blocking minority carrier access from the collector region of the BJT to the DTL. In the present embodiment, the DTL may be considered to be formed by a lower portion interfacing the substrate and a higher portion (or upper portion) interfacing the collector layer. The lower portion of the DTL (with respect to the growth direction of the layers of the BJT) is configured to terminate the BPDs and its thickness is selected to be sufficient to convert the BPDs into TEDs, which are not as harmful to device stability as compared to BPDs since TEDs generally do not split into partials and do not produce stacking faults. The transformation of a BPD into TED corresponds to a change of the line direction of the dislocation from in-plane to the threading line direction, i.e. to almost the normal to the basal plane. The higher portion (or upper portion) of the DTL is configured to block the access of minority carrier to any dislocation that may be present in the substrate or may be terminated in the DTL. The access of minority carriers is dependent on both the thickness and the doping level of the DTL. Thus, the thickness of the higher portion (and thereby the total thickness of the DTL) and the doping level of the DTL are selected to block minority carrier access from the collector region of the BJT to the lower portion of the DTL.

In this respect, it will be appreciated that SFs are two-dimensional crystal defects (portions of crystal planes), whereas dislocations are one-dimensional crystal imperfections, i.e. line defects. These two types of defects are therefore different. The growth of SFs in operating SiC devices can be performed based on a combination of minority carrier injection and of a proper seed, such as a BPD. As there is a certain probability for minority carrier diffusion through the buffer layer down to the substrate, where the BPDs are abundant, the growth of a stacking fault may then proceed from the substrate, through the DTL and into the collector region, thereby degrading the BJT performance. The inventor has recognized that a mere removal of the BPDs from the collector layer does not eliminate the growth of SFs.

The DTL of the BJT according to at least some of the embodiments are therefore configured to block the possibility of SF formation in the substrate or in the DTL itself with possible subsequent SF growth into the collector region by adjusting both the doping and the thickness of the DTL.

In particular, a lower portion of the DTL (i.e. the portion of the DTL adjacent or closest to the substrate) may be configured to terminate basal plane dislocations originating from the substrate and/or to convert the basal plane dislocations into threading edge dislocations, and a higher portion of the DTL (i.e. the portion of the DTL being adjacent or closest to the collector region) may be configured to block the access of minority carrier to any dislocation terminated in the DTL.

More specifically, the thickness and the doping level of a higher portion of the DTL are selected to block minority carrier access from the collector region of the BJT to a lower portion of the DTL.

According to an embodiment, the thickness of the DTL may be comprised in the range of about 12 to 30 micrometers.

According to an embodiment, the doping level of the DTL may be comprised in the range of about $3 \times 10^{18}$ to $2 \times 10^{19}$ cm$^{-3}$, and preferably in the range of about $5 \times 10^{18}$ to $1 \times 10^{19}$ cm$^{-3}$, which is advantageous since a relatively high donor doping (e.g. Nitrogen donors) contributes to the blocking of the access of minority carriers to any BPDs terminated in the DTL or in the substrate.

As will be further illustrated in the detailed description, stable BJTs can be manufactured with a DTL having a thickness comprised in the range of about 12 to 30 micrometers and a doping level in the range of about $3 \times 10^{18}$ to $2 \times 10^{19}$ cm$^{-3}$.

According to an embodiment, the DTL may be provided by epitaxial growth of SiC on top of the substrate and the dopant atom may be Nitrogen.

In particular, the SiC BJT may be a NPN BJT wherein the collector layer is an n-type collector region (acting as the voltage blocking layer) and the BJT further comprises a p-type base region and an n-type emitter region. The DTL may then be arranged between the substrate and the collector region. Although at least some of the embodiments are not limited to the following values, the doping levels are normally in the mid $10^{15}$ cm$^{-3}$ range for the collector region, in the mid $10^{17}$ cm$^{-3}$ range for the base region and in the order of $10^{19}$ cm$^{-3}$ for the emitter region.

According to an embodiment, the SiC BJT may further comprise a surface recombination suppression layer made of dielectric material and provided at a sidewall of the emitter region. Advantageously, this layer may be deposited both on the emitter region and around the emitter region. The present embodiment is advantageous in that it further improves the stability of the transistor.

According to a further embodiment, a switch-mode electrical power conversion device (or SMPC device) comprising a SiC BJT as defined any one of the preceding embodiments is provided, which is advantageous in that it results in an SMPC device with improved (longer) stability.

According to yet a further embodiment, a high power Radio-Frequency (RF) generator comprising a SiC BJT as defined in any one of the preceding embodiments is provided, which is advantageous in that it results in a high power RF generator with improved stability.

According to a third aspect, a method of evaluating the degradation performance of a SiC BJT comprising a collector region, a base region and an emitter region, is provided. The method can include applying a forward base-collector current under open emitter conditions, applying a stress current larger than the rated maximum base-emitter current of the BJT and maintaining the BJT at a temperature comprised in the range of about 80° C. to 120° C.

In particular, the current density may be comprised in the range of about 5 to 50 A per 1 cm² of the base area.

With reference to FIG. 1, there is shown a schematic view of a SiC BJT in accordance with an exemplifying embodiment.

FIG. 1 shows a SiC BJT 100 comprising a substrate 110, a defect termination layer (DTL) 120 and a collector layer 130. The DTL 120 is arranged between the substrate 110 and the collector layer 130. In the embodiment described with reference to FIG. 1, the SiC BJT 100 further comprises a base layer 140 of semiconductor (SiC) being of a different type than the type of the collector layer 130 and an emitter layer 160 of semiconductor (SiC) being of the same type as the type of the collector layer 130. The emitter 160, the base 140 and the collector 130 of the BJT are arranged as a stack of layers on top of the substrate 110. For example, the substrate 110 may be a highly doped n-type semiconductor substrate, the collector layer 130 may be a low-doped n-type semiconductor, the base layer 140 may be a p-type semiconductor and the emitter layer 160 may be a highly doped n-type semiconductor.

A BPD is a common defect in SiC substrate material, as well as in epitaxial layers. Commercially produced epitaxial structures in SiC are grown on off-oriented substrates, i.e. on substrates that are cut out from the single crystal ingot at a certain angle from the basal hexagonal plane. A BPD may be continued from the substrate into the epitaxial layers of the power device.

As mentioned above, BPDs may affect the performance of SiC power devices such as BJTs and, in particular, accelerate their degradation. Stability is one of the main issues for SiC-based bipolar power devices.

In some embodiments, the stability of the SiC BJT is improved by providing (or forming) a DTL 120 between the substrate 110 and the collector layer 130 and by adjusting the thickness and the doping level of the DTL 120. In particular, the thickness of the DTL 120 is adjusted for terminating BPDs within the bottom portion (or lower portion) of the DTL 120 and the doping level is adjusted for preventing growth of SFs from the DTL 120 to the collector layer 130.

Using a DTL, the BPD density is decreased from the substrate 110 to the DTL 120 because of a change of the dislocation line direction 1 from in-plane to almost normal to the basal plane (as indicated by the direction denoted 1a in FIG. 1). In other words, threading edge dislocation (TEDs) form from the BPDs within the DTL. The advantage is that TEDs are not as harmful to device stability as BPDs since TEDs generally do not split into partials and do not produce stacking faults.

For a substrate having a large off-axis such as an 8-degree off-oriented substrate, the BPD-to-TED conversion occurs at the substrate-to-layer interface (i.e. at the interface between the substrate 110 and the DTL 120) and the probability for conversion within the epitaxial layer 120 may be very low even if the DTL 120 would be tens of microns thick. Thus, it is advantageous if the off-axis orientation of the substrate is lower than 8 degrees and, in particular, if it is substantially close to 4 degrees or if it is a lower number.

Figure 2:
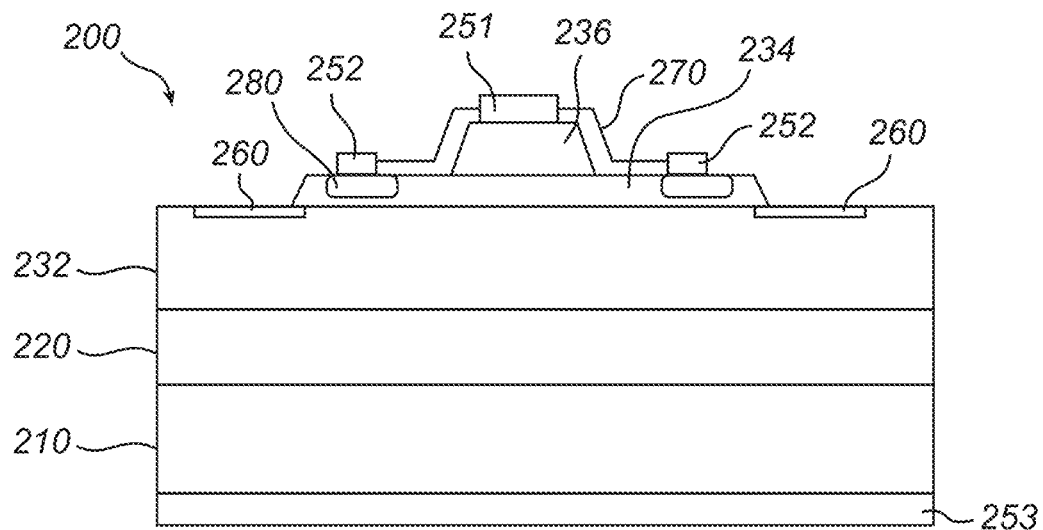
FIG. 2 shows a more detailed schematic view of a SiC BJT in accordance with another exemplifying embodiment.

With reference to FIG. 2, there is shown a SiC BJT in accordance with another exemplifying embodiment.

FIG. 2 shows a high-power SiC BJT 200 that is free, or at least almost free, from instability due to bipolar degradation and is formed on a conventional planar substrate 210.

According to an embodiment, the SiC BJT 200 may be an npn-type BJT. The BJT may be formed on a 4H-SiC substrate with a low off-orientation angle of approximately 4 degrees or lower. The epitaxial stack comprises at least four layers sequentially grown onto the substrate 210: a DTL 220, a low-doped n-type collector or collector region 232, a p-type base or base region 234 and a heavily doped n-type emitter or emitter region 236. In the example shown in FIG. 2, the NPN BJT is a vertical BJT wherein a mesa comprising the emitter 236 has been formed (e.g. via etching).

The BJT may also be provided with ohmic emitter, base and collector contacts 251-253 for the emitter 236, the base 234 and the collector 232, respectively, as well as with peripheral junction termination regions 260 to prevent from (or at least reduce the risk of) early breakdown over the outer device periphery. A dielectric surface recombination suppression (SRS) layer 270 may also be provided at and around the sidewall (i.e. the periphery) of the emitter mesa 236 to suppress excessive surface recombination and to avoid, or at least reduce, surface-related gain instability. The SRS layer may be deposited both on top and around the emitter region (or mesa) 236 as shown in FIG. 2. Further, the SRS layer 270 may advantageously extend laterally (by a certain distance) over the surface of the passive base region (which corresponds to the portion of the base region 234 that is laterally spaced from the emitter mesa 236, i.e. the portion of the base region 234 not interfacing the emitter region 236). In particular, the lateral extension of the SRS layer 210 over the passive base region may be greater than three times the base thickness as measured from the metallurgical base-to-emitter p-n junction. The material of the SRS layer 270 may be selected from the group including silicon dioxide, silicon oxinitride, aluminum oxide or aluminum nitride. Alternatively, the SRS layer 270 may comprise a stack including more than one of the dielectric materials of said group. The use of the SRS layer 270 is advantageous in that it further improves the stability of the silicon carbide BJT. Without such a dielectric SRS layer 207, the SiC BJT would be unstable due to instability of carrier recombination at the surface, even though such a BJT may not suffer from the degradation due to the growth of stacking faults.

The DTL 220 has a double function which is first to terminate the BPDs from the substrate 210 and block (or at least limit) the access of minority carriers to the BPDs terminated within the DTL 220 such that growth of SFs is prevented. For this purpose, the thickness and the doping level of the DTL 220 are configured to terminate the BPDs in the DTL 220 and to prevent the growth of stacking faults from the DTL 220 to the collector layer 232. The termination of BPDs from the substrate 210 in the DTL 220 is achieved through conversion of BPDs into TEDs through the use of a substrate 210 with a low off-orientation angle of 4 degrees or lower, and preferably in the range of 2 to 4 degrees. Referring to the second function of the DTL 220, it will be appreciated that minority carriers are present under certain operation modes of the device, such as for example in BJT saturation. If minority carriers are allowed to access the BPDs in the bottom portion (nearest to the substrate, which may be referred to as the lower portion in the following) of the DTL 220, then stacking faults may start propagating along the basal plane and eventually reach the active layers 232-236 of the BJT resulting in performance degradation. Thus, the DTL thickness advantageously exceeds the sum of the thickness for the BPD to TED conversion plus the thickness for blocking substantial minority carrier access to the dislocations terminated in the DTL, i.e. to the lower portion of the DTL. The access of minority carriers is, on the other hand, strongly dependent on the doping level of the DTL. For a particular thickness, the doping level of the DTL 220 is therefore so adjusted that growth of SFs is prevented (or vice versa).

From a processing standpoint, the thickness of the DTL 220 would preferably be as low as possible since extra thickness leads to increased process time and cost. Further, the doping level, e.g. a Nitrogen doping level, of the DTL 220 is also preferably kept at a low value since excessive dopant concentrations may deteriorate the SiC material quality and may suppress BPD to TED conversion. However, the functions of the DTL can be about the opposite.

According to an embodiment, the thickness of the DTL 220 may be comprised in the range of 12 to 30 micrometers, which is advantageous in that it provides a sufficient thickness for terminating the BPDs in the DTL 220 and results in an acceptable yield for the manufacturing of large-area high-power BJTs.

According to another embodiment, the doping level of the Nitrogen in the DTL is comprised in the range of $3\times10^{18}$ to $2\times10^{19}$ cm$^{-3}$, and more preferably in the range of $5\times10^{18}$ to $1\times10^{19}$ cm$^{-3}$, which is advantageous in that the growth of SFs from the bulk of the DTL into the collector layer is reduced. It has been observed that higher levels of Nitrogen doping tend to generate new defects within the DTL such as e.g. 3C polytype inclusions and in-grown stacking faults. The doping level of the DTL is therefore preferably limited.

In the following, a more detailed but non-limiting method of manufacturing a silicon carbide BJT is described. In the present embodiment, the SiC substrate may be a substrate with an off-orientation angle of approximately 4 degrees off the basal (0001) crystal plane. The off-orientation direction may preferably be chosen towards the [11-20] crystal direction since this direction provides an improved layer morphology as compared to other off-orientation directions. However, it will be appreciated that at least some of the embodiments are not limited to such an off-orientation direction and that other off-orientation directions such as [1-100] may also be employed since there is a marginal difference in layer quality between different off-orientation directions. Silicon carbide is a polar crystal, i.e. the crystal face properties are dependent on the sign of crystal direction. The [0001] crystal plane is commonly referred to as the silicon crystal face to distinguish it from the opposite [000-1] carbon face. Silicon crystal face can be used for SiC device epitaxy, however the carbon face may also be used in some embodiments. A so-called epitaxy-ready substrate may preferably be used, which means that the substrate may comprise a high quality surface finish provided by an appropriate surface cleaning. Optionally, additional surface finish routines known in crystal preparation techniques may be applied if the received substrate finish is of insufficient quality. The substrate 220 is preferably a low-resistivity n-type material.

The substrate 210 may then be placed in a Chemical Vapor Deposition (CVD) machine to perform deposition of the epitaxial layers for the desired operation of the BJT. The layer structure of the BJT may be formed by sequential deposition of an n-type DTL layer 220, a lightly doped n-type collector layer 232, a p-type base layer 234 and a heavily doped n-type emitter layer 234. For example, an optimized BJT in silicon carbide may comprise a low-doped collector layer 232 with a thickness of approximately 1 µm per 100 V of the desired blocking voltage. Thus, a blocking range between 600 V and 1.8 kV can be based on a collector thickness between approximately 5 and 20 micrometers. Further details of the optimization of the parameters of the layers of a BJT are known to persons skilled in the art and are therefore deliberately omitted here. It will be appreciated that BJT designs optimized for specific applications might employ non-uniform doping profiles rather than flat doping profiles for the base, emitter or collector regions. The doping profiles may for example be changed either in graded or in stepwise manner.

The CVD growth of silicon carbide may be performed at a high temperature of 1550-1650° C. Substantially higher deposition temperatures may be undesirable for CVD growth of silicon carbide on low off-orientation substrates due to deterioration of the surface morphology (also referred to as step bunching). The step bunching may develop on low off-orientation substrates at high deposition rate. Generally, the CVD growth can be performed based on pump-down and purge of equipment, heat-up in hydrogen ambient to the deposition temperature, pre-epitaxial hydrogen etch for removal of surface contamination and/or damage, and subsequent deposition of desired epitaxial layers using appropriate carbon and silicon precursors under well controlled conditions. The deposition rate is preferably kept substantially low such that precursor oversaturation at the wafer surface does not result in structural defect formation. Nitrogen and aluminum precursors may be introduced in an amount in order to achieve the desired level of donor or acceptor doping. Silane and propane may be used as silicon and carbon precursors for the growth of SiC. However, other precursors like, for example, chlorosilanes may also be employed for deposition of SiC. Chlorosilanes may for example be introduced into the reaction chamber using silicon tetrachloride instead of silane as silicon precursor, or by using methyltrichlorosilane or by introduction of HCl into the reaction chamber. It will be appreciated that at least some of the embodiments are not limited to such precursors and that other precursors providing the appropriate process chemistry may be envisaged.

Subsequently, any deposit on the back side of the substrate due to the CVD growth process may be removed using plasma etch. A normal manufacturing process may also include patterning and etching of the emitter region or mesa 236, patterning and etching of the base region or mesa 234, and forming the junction termination region 260 at the periphery of the base mesa 234, such as illustrated in FIG. 2. Outline of the base mesa 234 may advantageously have sufficiently rounded edges to prevent electric field concentration at its periphery. The junction termination region 260 is intended to prevent the device from electric field concentration at the periphery, thereby preventing early breakdown. The junction termination region 260 may be formed by a number of techniques, such as for example the junction termination extension technique. Further, a ring with an accurately controlled acceptor dose may be formed at the periphery of the base mesa 234 by implantation of boron or aluminum ions into the device periphery, the acceptor dose corresponding to full depletion of the implanted region at approximately 50 to 70% of the theoretical breakdown voltage. The dose may advantageously be in the range of approximately $0.9\times10^{13}$ to $1.2\times10^{13}$ cm$^{-2}$ for electrically active acceptors in the junction termination extension (JTE) region.

A highly doped p-type subcontact region 280 may optionally be formed underneath the desired location of ohmic base contacts 252 by selective implantation of Al acceptor ions into the passive base (or passive part of the base). Acceptor ion implants may then be followed by annealing at a high temperature between 1500° C. and 1700° C. to activate the acceptor ions.

Further manufacturing stages may include the SRS layer formation and the formation of the ohmic contacts 251-253 to the emitter region 236, to the base region 234 and to the backside of the substrate 210. A two-level metal interconnect is preferably formed to reduce, and preferably minimize, the on-state device resistance, as well as to ensure long-term stability of the contact metallization.

Silicon carbide material technology is currently not as mature as silicon technology, and a certain fraction of high power devices fails to meet expected performance. A fraction of manufactured SiC devices does not reach expected breakdown voltage, yet another fraction does not have expected emitter current gain. There is therefore also a need in providing a method of detecting potentially unstable BJTs in the course of standard burn-in tests.

In accordance with another aspect, the stability of a high-power BJT may be verified through the burn-in of manufactured components with subsequent tests as part of the fabrication. Some fraction of electrically fault-free components may experience growth of stacking faults, thereby leading to performance degradation. The degraded components will then show a transformation of output characteristics and exhibit a low Early voltage. On the other hand, any stable BJT retains substantially flat output characteristics.

The burn-in stress may be performed at various stages such as on-wafer or in already packaged components.

In the following, a method of evaluating the degradation performance of a SiC BJT is described.

The method can include applying a forward base-collector current under open emitter conditions in order to enhance the injection of minority carriers and maintaining the BJT at an elevated device temperature between 80° C. and 120° C. The stress current may advantageously be above the rated maximum base-emitter current. The current density can be between 5 and 50 A/cm$^2$ and a cumulative stress charge is between 3 and 7 Ah/cm$^2$.

With reference to FIGS. 3a and 3b, the output characteristics of a stable high-power high-voltage BJT manufactured in accordance with an exemplifying embodiment and of a degraded device, respectively, are described.

FIGS. 3a and 3b show the output characteristics of BJTs having an area of 5 mm$^2$. The output characteristics are measured for five different gate currents with a current step of 50 mA.

FIG. 3a shows the output characteristic of a stable BJT manufactured in accordance with an embodiment while FIG. 3b shows the output characteristic of an unstable component after a 20-minute stress with a base-collector current of 1A at 90° C. Both output characteristics were measured on-wafer using a probe station. The output characteristic shown in FIG. 3a for a power device manufactured in accordance with an embodiment of at least some of the embodiments are identical to the initial output characteristic of the device. Further, the output characteristics of the stable and the unstable components were identical prior to the stress test.

According to an embodiment, a 20-minute forward-bias base-collector stress at a current of 1 Ampere results in a substantial transformation of the output characteristics of a potentially unstable BJT. Referring to the output characteristic shown in FIGS. 3a and 3b, a further 10-hour stress test of the two devices does not result in any further changes of the output characteristics. Unstable components with a moderate degradation may become stabilized, i.e. a longer stress will not result in further degradation of their output characteristics.

Still referring to FIG. 3a, the output characteristics of a stable BJT manufactured in accordance with an embodiment features a linear saturation region at a low collector bias and an almost flat active region above a certain collector bias threshold. In the active flat region, the output current of defect-free SiC BJTs does not increase with collector bias because the base depletion voltage is very high, over 1000V. The on-state tests are performed at up to 5-10 Volt, for which range no significant modulation of the neutral base thickness occurs.

However, a high output conductance is observed for the active region of the degraded SiC BJTs, as shown on the output characteristics of FIG. 3b. The output conductance of the degraded SiC BJTs may originate from retardation of vertical carrier transport by the SFs grown in the low-doped collector.

High power BJTs passing the degradation stress, i.e. without any region of high output conductance such as shown in FIG. 3b, are stable to further long-term bipolar stress. Thus, it is advantageous to apply the method of evaluating the performance of a bipolar transistor during a limited time period. No further indication of growth of stacking faults has been observed even if the BJTs were tested for up to 600 hours. At least some embodiments therefore provide a short-term bipolar stress as test for stability of the BJTs.

With reference to FIG. 4, statistics of the conductance of the active region of BJTs in accordance with an embodiment are described.

The output conductance of a BJT can be used as a quantitative measure of the extent of bipolar degradation due to stress conditions applied on the BJT. FIG. 4 shows a histogram comprising values of the output conductance (in Siemens, i.e. 1/Ohm) for the active-mode device operation measured after stress for a plurality of operable devices fabricated according to an embodiment on a single wafer. The active-mode device operation of the BJT corresponds to the flat portion of the IV characteristics shown in FIGS. 3a and 3b, i.e. at collector bias above 3V. The measured conductance does therefore not correspond to the on-state conductance which is derived from the slope of the linear region of the IV characteristics for collector bias below 2-3 V, with reference to FIGS. 3a and 3b. It will be appreciated that the measure of a conductance in the active-mode device operation is indicative of a transition from BJT stability to bipolar degradation. According to the data shown in FIG. 4, 85% of the devices manufactured according to the method have a negligible (i.e. nearly zero) active-region output conductance after the bipolar stress. FIG. 4 therefore demonstrates that at least some embodiments provide a method of manufacturing degradation-free BJTs with a high yield. Thus, together with further improvements of the quality of silicon carbide substrate, it can be envisaged that high-power BJTs with a much higher current rating than 10 A can be manufactured.

According to the present embodiment, the BJTs are designed with a 15 μm thick DTL and a doping level of $5 \times 10^{18}$ cm$^{-3}$. The structure of the BJTs comprises also an oxinitride SRS, ion-implanted subcontact regions in the base and a 2-level metallization, as shown in one of the embodiments described above in connection to FIG. 2. Further, the structure comprises a 12 μm thick low-doped collector layer. The stress or method of evaluating the degradation of the BJTs was performed for 20 minutes at a base-collector current of 1A with open emitter conditions at a chuck temperature of 90° C. An automated probe station may be used to apply the stress in unattended mode. As shown in FIG. 4, most of the BJTs do not experience any degradation. The fraction of degraded devices is 15%, illustrating that at least some embodiments provide a method of manufacturing high power BJTs (or high power SiC-based devices in general) which are degradation free, or at least with a low risk of degradation, at a high yield. At least some of the embodiments are also advantageous in that they provides a long-term device reliability even though the yield of non-degrading components does not reach 100%.

A fabrication sequence for manufacturing large-area high-power BJTs in accordance with an embodiment can include manufacturing the BJT such as defined in any one of the above embodiments described with reference to FIGS. 1-3 and the step of evaluating the manufactured BJT in accordance with any one of the above embodiments described with reference to FIG. 4.

A fabrication sequence for manufacturing a large area SiC BJT can include: (i) epitaxy (for forming the various layers of the device such as the DTL, the collector layer, the base layer and the emitter layer), (ii) patterning of emitter and base mesas (for forming the structure of the BJT such as e.g. shown in FIG. 2), (iii) acceptor ion implantation (for forming a subcontact region for the ohmic base contact), (iv) implantation anneal (for activating the dopants introduced by ion implantation), (v) deposition of a SRS dielectric material (such as described above with reference to FIG. 2), (vi) metallization (for forming the contacts such as contacts 251-253 shown in FIG. 2), (vii) degradation test such as described above and (viii) an acceptance test (which comprises a comparison of the results of e.g. conductance obtained from the degradation test with a threshold).

Figure 5:
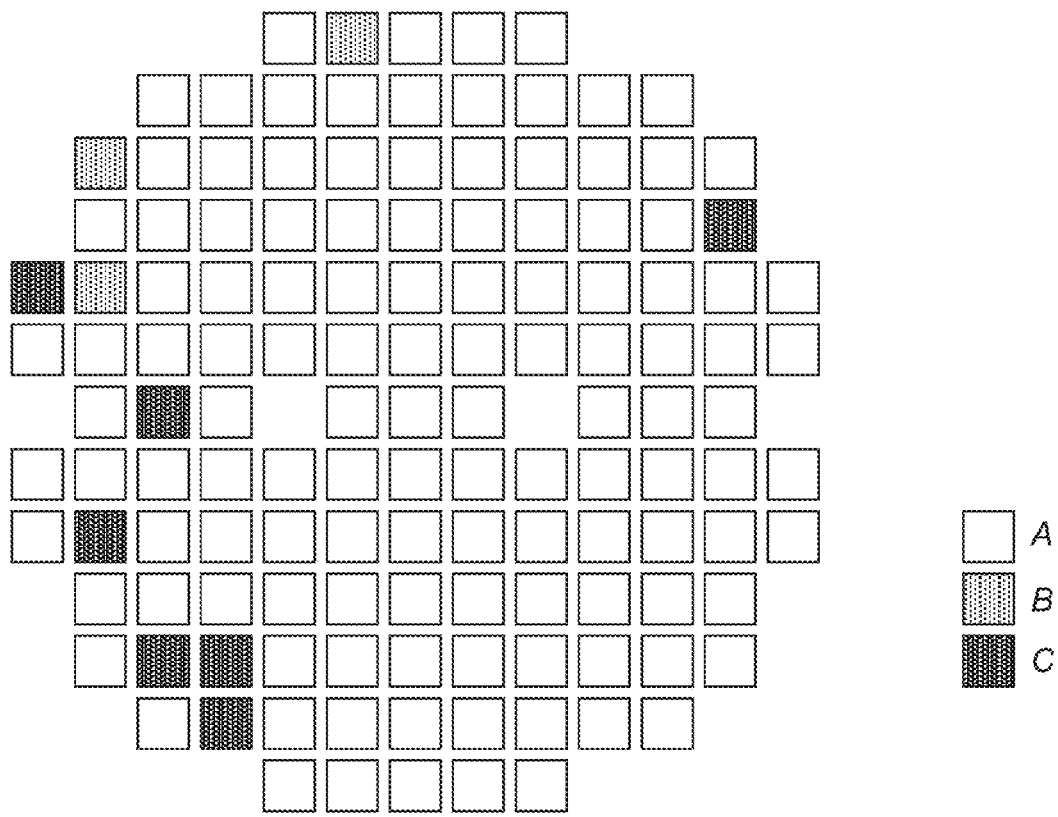
FIG. 5 shows the BPD occurrence map for a 3-inch wafer for high-power BJTs manufactured in accordance with an embodiment.

FIG. 5 shows a schematic map of a 3-inch wafer with a plurality of chips illustrating the BPD occurrence for power device manufactured in accordance with an embodiment.

FIG. 5 represents the BPD density for a 20 µm thick DTL grown on a 4-degree off-oriented SiC wafer. The BPDs were counted in 5.3 mm² rectangles over the area of a 3-inch SiC wafer. The BPD density measurements were performed using a defect-selective etch in molten potassium hydroxide (KOH) at 480° C. In FIG. 5, squares of type A represent areas without any presence of BPDs, squares of type B represent areas comprising a single BPD and squares of type C represent areas comprising multiple BPDs. The results show that the BPD density may be decreased as a function of the DTL thickness, wherein a decrease of BPD density from 12-20 BPD/cm² for a 7 µm thick DTL to a much lower value for a DTL having a thickness of around 20 µm has been observed.

Still referring to FIG. 5, only 10 of 131 fields or chips having an area of about 5.3 mm² comprises BPDs, which corresponds to an effective BPD density below 1.5 cm$^{-2}$ as calculated for a sampling area of 5.3 mm². The result depicted in FIG. 5 also shows that large wafer areas may be totally free from BPDs, which demonstrates the possibility of manufacturing degradation-free bipolar devices over 1 cm² in area. Certain defective wafer regions still exist, which comprise multiple BPDs. Thus, an evaluation of the resulting wafer using a standard approach based on "mean" BPD density may not be satisfactory for high quality SiC material. As it follows from FIG. 5, the BPD density may be very non-uniform for high quality epitaxial SiC wafers, therefore standard Gaussian statistics may not apply.

Further, BPDs may be totally eliminated, or at least the number of BPDs may be significantly reduced, over the major part of the wafer after growing a DTL having a thickness of about 15 µm. In this specific example, most of the BPDs present in the substrate are converted into TEDs at the interface between the substrate and the DTL, and the rest of the BPDs are converted into TED after approximately 5-15 µm in the DTL.

For illustrating the above mentioned evaluating method and, in particular, for illustrating the effect of the doping level of the DTL on the degradation performance of the device, a set of p-i-n test devices were fabricated and evaluated.

Figure 6A:
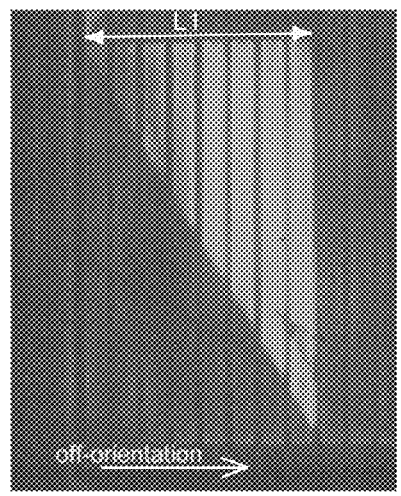
FIGS. 6a and 6b show light emission images for two types of test devices having different DTL.
Figure 6B:
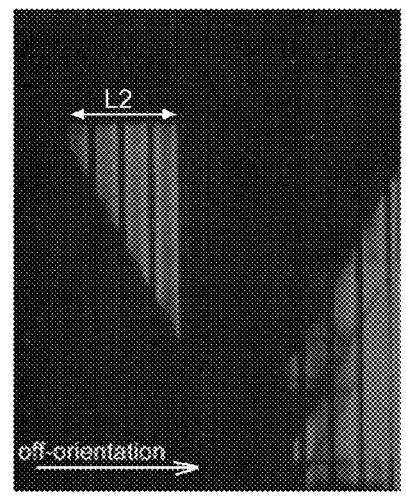

A first type of test device featured a 15 µm thick DTL doped at a level of $1.5 \times 10^{17}$ cm$^{-3}$ grown on a substrate having an off-axis orientation of 4 degrees. A 10 µm thick low-doped ($1.5 \times 10^{15}$ cm$^{-3}$) n-type layer and a 1 µm thick p+ layer (doped to $1 \times 10^{18}$ cm$^{-3}$) were deposited on top of the DTL during the same process of epitaxy. A partially transparent grid-type contact was formed on the top side of the device (i.e. on the p+ layer), and an Ohmic contact was applied to the back side (i.e. at the substrate). The grid electrode on top of the p-type layer is a set of vertical stripes with a period of 50 µm. A second type of test device had a different DTL with a doping level of $5 \times 10^{18}$ cm$^{-3}$ and a thickness of 15 µm. Except for the doping of the DTL, the structure and the process were identical for both types of test devices. A forward-bias bipolar stress at a current of 1A for 20 minutes was applied to the test devices in order to test the bipolar stability. The stress was done at 90° C. in the same manner for both types of test devices. The test devices can be compared using images of light emission from the stacking faults grown in the test devices. FIG. 6a shows an emission image of a stacking fault grown in the test device of the first type as a result of bipolar stress. FIG. 6b shows the emission image of the test device of the second type. The images were taken using a probe station with a charge-coupled device (CCD) camera and using a narrow bandpass filter with a peak transmission at 420 nm in order to enhance the emission of the SF. Both images have the same scale.

The comparison of the two images clearly shows that the stacking faults grown in a structure of the first type, i.e. with a low-doped DTL, are much larger. For the test device shown in FIG. 6a, the extension of the visible SF along the off-orientation direction, which is denoted L1 in FIG. 6a, is 385 µm (micrometers), whereas for the test device shown in FIG. 6b the extension of the visible SF along the off-orientation direction, which is denoted L2 in FIG. 6b, is equal to 186 µm. As a stacking fault can only, in some embodiments, propagate within the basal plane, the penetration of an SF beneath the surface is determined by the stacking fault length according to the following formula: D=L*sin(ALPHA), wherein D is the penetration depth, L the extension of the stacking fault along the off-orientation direction and ALPHA is the off-orientation angle (which is 4 degrees for both test devices in the present example). For the test device of the first type (FIG. 6a), the penetration depth of an SF is calculated to be approximately 27 µm in the crystal depth, i.e. approximately the total thickness of the n-type layer (10 µm), of the DTL (15 µm) and of the anode layer (i.e. the p+ layer, 1 µm). In comparison, the depth of SF penetration for the test device of the second type is measured to be approximately 13.5 µm (FIG. 6b), which means an SF penetration into the DTL of about 2-3 µm. The images of FIG. 6 clearly illustrate that low-doped DTL layers are not capable of preventing the propagation of stacking faults since minority carrier concentration in such DTL layers is too high. Any portion of BPD present in the DTL can cause formation and growth of an SF under the conditions of minority carrier injection, which conditions are rather common for operation of a high power BJT. In contrast, a heavily doped and substantially thick DTL provides reliable blocking of the SF propagation, as it is also demonstrated by the data presented in FIGS. 3, 4 and 5.

Even though embodiments have been described with reference to specific exemplifying embodiments thereof, many different alterations, modifications and the like will become apparent for those skilled in the art. The described embodiments are therefore not intended to limit the scope, as defined by the appended claims.

What is claimed is:
1. A method of manufacturing a silicon carbide, SiC, bipolar junction transistor, comprising:

forming a collector region on a substrate having an off-axis orientation less than or equal to approximately 4 degrees; and forming a defect termination layer disposed between the substrate and the collector region, the defect termination layer having a thickness in a range of approximately 12 to 30 micrometers for terminating basal plane dislocations in the defect termination layer and having a doping level in a range of approximately $3\times10^{18}$ to $2\times10^{19}$ cm$^{-3}$.

2. The method of claim 1, wherein the off-axis orientation of the substrate is in a range of approximately 2 to 4 degrees.

3. The method of claim 1, wherein the doping level of the defect termination layer is in a range of approximately $5\times10^{18}$ to $1\times10^{19}$ cm$^{-3}$.

4. The method of claim 1, wherein the forming of the defect termination layer includes epitaxial growth of SiC on top of the substrate, the doping level of the defect termination layer includes a Nitrogen dopant atom.

5. A silicon carbide, SiC, bipolar junction transistor (BJT) comprising:
   an emitter region,
   a base region,
   a collector region disposed on a substrate having an off-axis orientation less than or equal to approximately 4 degrees; and
   a defect termination layer disposed between the substrate and the collector region,
   the defect termination layer having a thickness in a range of approximately 12 micrometers to 30 micrometers for terminating basal plane dislocations in the defect termination layer and having a doping level in a range of approximately $3\times10^{18}$ to $2\times10^{19}$ cm$^{-3}$.

6. The SiC BJT of claim 5, wherein the off-axis orientation of the substrate is in a range of approximately 2 to 4 degrees.

7. The SiC BJT of claim 5, wherein the doping level of the defect termination layer is in a range of approximately $5\times10^{18}$ to $1\times10^{19}$ cm$^{-3}$.

8. The SiC BJT of claim 5, wherein the defect termination layer includes SiC doped with Nitrogen.

9. The SiC BJT of claim 5, further comprising a surface recombination suppression layer including a dielectric material and being formed at a sidewall of the emitter region.

10. A switch-mode electrical power conversion device comprising a SiC BJT as defined in claim 5.

11. A high power Radio-Frequency generator comprising a SiC BJT as defined in claim 5.

12. A silicon carbide, SiC, bipolar junction transistor (BJT) comprising:
    an emitter region,
    a base region,
    a collector region disposed on a substrate having an off-axis orientation less than or equal to approximately 4 degrees; and
    a defect termination layer disposed between the substrate and the collector region,
    the defect termination layer having a thickness in a range of approximately 12 to 30 micrometers for terminating basal plane dislocations in the defect termination layer.

13. The SiC BJT of claim 12, wherein the off-axis orientation of the substrate is in a range of approximately 2 to 4 degrees.

14. The SiC BJT of claim 12, wherein the defect termination layer has a doping level in a range of approximately $5\times10^{18}$ to $1\times10^{19}$ cm$^{-3}$.

15. The SiC BJT of claim 12, wherein the defect termination layer has a doping level in a range of approximately $3\times10^{18}$ to $2\times10^{19}$ cm$^{-3}$.

16. The SiC BJT of claim 12, wherein the defect termination layer includes SiC doped with Nitrogen.

17. The SiC BJT of claim 12, further comprising a surface recombination suppression layer including a dielectric material and being formed at a sidewall of the emitter region.

18. A switch-mode electrical power conversion device comprising a SiC BJT as defined in claim 12.

19. A high power Radio-Frequency generator comprising a SiC BJT as defined in claim 12.

* * * * *